United States Patent
Sekine et al.

(10) Patent No.: US 10,629,506 B2
(45) Date of Patent: *Apr. 21, 2020

(54) PREFORM FOR SEMICONDUCTOR ENCAPSULATION

(71) Applicant: NAPRA CO., LTD., Katsushika-Ku, Tokyo (JP)

(72) Inventors: Shigenobu Sekine, Tokyo (JP); Chihiro Shimaya, Tokyo (JP)

(73) Assignee: Napra Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/630,599

(22) Filed: Jun. 22, 2017

(65) Prior Publication Data

US 2018/0218954 A1    Aug. 2, 2018

(30) Foreign Application Priority Data

Jan. 27, 2017 (JP) ................................. 2017-012892

(51) Int. Cl.

| | | |
|---|---|---|
| *H01L 23/06* | (2006.01) | |
| *C22C 13/00* | (2006.01) | |
| *H01L 23/29* | (2006.01) | |
| *C22C 9/00* | (2006.01) | |
| *B32B 15/01* | (2006.01) | |
| *B23K 35/26* | (2006.01) | |
| *H01L 21/56* | (2006.01) | |
| *H01L 23/02* | (2006.01) | |
| *B23K 35/30* | (2006.01) | |

(Continued)

(52) U.S. Cl.
CPC .............. *H01L 23/06* (2013.01); *B23K 35/26* (2013.01); *B23K 35/262* (2013.01); *B23K 35/30* (2013.01); *B23K 35/302* (2013.01); *B32B 15/01* (2013.01); *C22C 9/00* (2013.01); *C22C 9/02* (2013.01); *C22C 13/00* (2013.01); *H01L 21/56* (2013.01); *H01L 23/02* (2013.01); *H01L 23/29* (2013.01); *H01L 23/3121* (2013.01)

(58) Field of Classification Search
CPC ... H01L 21/561; H01L 21/565; H01L 21/566; H01L 23/06; H01L 23/29; H01L 21/56; H01L 23/02; H01L 23/3121; C22C 13/00; C22C 9/00; C22C 9/02; B32B 15/01; B23K 35/262; B23K 35/26; B23K 35/302; B23K 35/30
See application file for complete search history.

(56) References Cited

U.S. PATENT DOCUMENTS

| | | | |
|---|---|---|---|
| 7,816,794 B2 | 10/2010 | Sakinada et al. | |
| 2003/0006668 A1* | 1/2003 | Lal ........................... | G21H 1/00 310/301 |

(Continued)

FOREIGN PATENT DOCUMENTS

| | | |
|---|---|---|
| JP | 2002-124533 A | 4/2002 |
| JP | 2006-203149 A | 8/2006 |

(Continued)

*Primary Examiner* — Su C Kim
(74) *Attorney, Agent, or Firm* — Carrier Blackman & Associates, P.C.; Joseph P. Carrier; Anne G. Sabourin

(57) ABSTRACT

Disclosed is a preform for semiconductor encapsulation, mainly containing a metal or alloy, the metal or alloy further containing Sn or Sn alloy, and, Cu or Cu alloy, and still further containing at least 2% by weight of an intermetallic compound of Cu and Sn.

7 Claims, 2 Drawing Sheets

(51) Int. Cl.
*C22C 9/02* (2006.01)
*H01L 23/31* (2006.01)

(56) References Cited

U.S. PATENT DOCUMENTS

| | | | | |
|---|---|---|---|---|
| 2004/0112478 | A1* | 6/2004 | Bieler | B23K 35/26 |
| | | | | 148/538 |
| 2005/0253282 | A1* | 11/2005 | Lu | B81C 1/00269 |
| | | | | 257/787 |
| 2010/0291399 | A1 | 11/2010 | Kato et al. | |
| 2013/0153646 | A1* | 6/2013 | Ho | B23K 1/0016 |
| | | | | 228/256 |
| 2013/0256848 | A1* | 10/2013 | Kawabata | H01L 23/60 |
| | | | | 257/659 |
| 2014/0261924 | A1* | 9/2014 | Wetzel | C22F 1/08 |
| | | | | 148/684 |
| 2016/0133579 | A1* | 5/2016 | Akiba | H01L 23/552 |
| | | | | 257/659 |
| 2016/0158027 | A1 | 6/2016 | Birkbeck et al. | |
| 2016/0158897 | A1* | 6/2016 | Koroki | B23K 35/26 |
| | | | | 148/24 |
| 2017/0062193 | A1* | 3/2017 | Schultheis | H01J 37/3423 |
| 2017/0271270 | A1* | 9/2017 | Dias | H01L 23/552 |

FOREIGN PATENT DOCUMENTS

| | | |
|---|---|---|
| JP | 2011-062736 A | 3/2011 |
| JP | 2011-080796 A | 4/2011 |
| JP | 2013-172055 A | 9/2013 |
| WO | 2008/026761 A1 | 3/2008 |
| WO | 2014/168027 A1 | 10/2014 |

* cited by examiner

PREFORM FOR SEMICONDUCTOR ENCAPSULATION

INCORPORATION BY REFERENCE

This application is based on Japanese Patent Application No. 2017-012892, filed on Jan. 27, 2017, the content of which is incorporated hereinto by reference.

BACKGROUND OF THE INVENTION

1. Field of the Invention

This invention relates to a preform for semiconductor encapsulation.

2. Description of the Related Art

SiC semiconductor element has been developed in recent years. The SiC semiconductor element has attracted public attention as a power device that can control high power, owing to its higher breakdown strength and wider band gap as compared with those of Si semiconductor element. The SiC semiconductor element can operate at a temperature of 150° C. or higher where the Si semiconductor element cannot resist, and is reportedly operable even at 500° C. or above on the theoretical basis (see JP-A-2011-80796).

This sort of power devices are used under harsh environments such that they are operated at higher temperatures over a long duration or time, even accompanied by large temperature changes from operational states at high temperatures down to operational states at low temperatures. Accordingly, semiconductor devices, having a semiconductor element and connecting members connected thereto, are required to keep high levels of bonding strength and heat resistance of the joint portions where both components are joined, over a long duration of time.

Now for the protective purposes, the semiconductor element is housed in a case, and sealed with a sealing layer made of a resin encapsulant filled inside the case, so as to be used in the form of encapsulated semiconductor device.

At present, the sealing layer made of the resin encapsulant is resistant to heat up to 150° C. Above 150° C. where the SiC semiconductor element operates, the sealing layer will degrade to produce a gap therein, making the semiconductor device disadvantageous to remain durable enough. For this reason, there is no choice at present but to use the SiC semiconductor element within a temperature range not exceeding the heat resistant temperature of the sealing layer, and this limits the SiC semiconductor element from fully demonstrating its performance.

Another known example relates to use of a solder mainly composed of Sn (Sn-based solder) as a metal encapsulant, rather than using the resin encapsulant. However the Sn-based solder, whose melting temperature is approximately 200 to 230° C., is still insufficient in terms of heat resistance, if it is to be used as the sealing layer of the power devices.

The Sn-based solder is also anticipated to produce a void after prolonged operation at high temperatures, or under harsh environments accompanied by large temperature changes from operational states at high temperatures down to operational states at low temperatures, and this degrades reliability of the product.

SUMMARY OF THE INVENTION

It is therefore an object of this invention to provide a preform for semiconductor encapsulation with high heat resistance, high reliability and high quality.

To address the problem described above, there is provided a preform for semiconductor encapsulation of this invention, which mainly includes a metal or alloy, the metal or alloy further includes Sn or Sn alloy, and, Cu or Cu alloy, and still further includes at least 2% by weight of an intermetallic compound of Cu and Sn.

DESCRIPTION OF THE EMBODIMENTS

In this specification, each of words "metal", "metal particle", "metal component", "Sn" and "Cu" not only represents a simple metal substance, but may also represent an alloy containing two or more kinds of metal elements.

Figure 1:
FIG. 1 is a schematic drawing illustrating an exemplary preform for semiconductor encapsulation of this invention.

This invention will be explained referring to FIG. 1. A preform for semiconductor encapsulation 1 is composed of a first layer 11. The first layer 11 is mainly composed of a metal or alloy. The metal or the alloy contains Sn or Sn alloy, and, Cu or Cu alloy. Assuming the total weight of Sn or Sn alloy, and Cu or Cu alloy is 100% by weight, the content of Cu or Cu alloy is preferably, but not limitatively, in the range from 1% by weight to 80% by weight. The preform further contains at least 2% by weight of an intermetallic compound of Sn and Cu ($Cu_xSn_y$).

Since, as described above, the preform for semiconductor encapsulation 1 contains Sn or Sn alloy, it begins to melt at around 230° C. which is the melting point of Sn. The molten Sn and Cu diffuse into each other by way of solid-phase diffusion, to thereby form the intermetallic compound $Cu_xSn_y$. There is no need to elevate the temperature up to the melting point of Cu, since Cu can diffuse by way of solid-phase diffusion. It becomes therefore possible to form the sealing layer at temperatures at which substrate or electronic parts will not be damaged. In this embodiment, the sealing layer may be formed specifically at around 280° C., although depending on the Cu content in the preform for semiconductor encapsulation 1, and Cu particle size.

The thus formed sealing layer contains the intermetallic compound $Cu_xSn_y$ (typically $Cu_3Sn$ and $Cu_6Sn_5$). Since $Cu_3Sn$ melts at approximately 676° C., and $Cu_6Sn_5$ at approximately 415° C., the sealing layer after melted under heating and then solidified will have an elevated re-melting temperature.

For example, when SAC305 (96.5% Sn-3.0% Ag-0.5% Cu) is melted under heating, the molten Sn is forced to agglomerate and round by surface tension. If pressurized in this state, the molten SAC305 will run off to the periphery, rather than being kept staying there.

Figure 2:
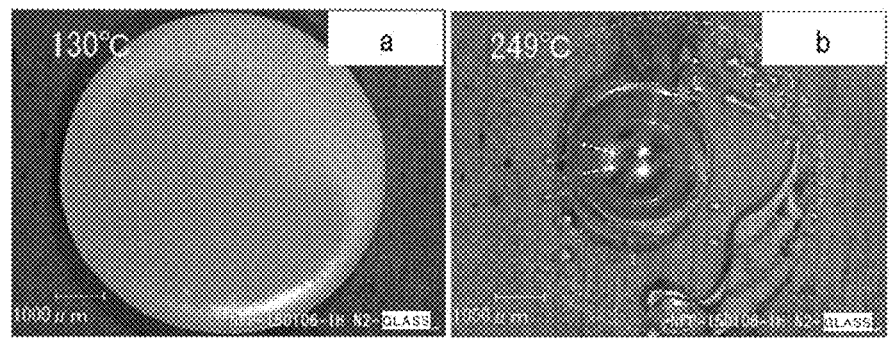
FIG. 2 shows images explaining surface tension of SAC305.

FIG. 2 shows images of SAC305 after coated in a pasty form onto a glass plate and heated. Image "a" shows a state observed at 130° C., and image "b" shows a state observed at 249° C. As seen in "a", SAC305 at 130° C. spreads over the entire area of the glass plate, whereas it melts at 249° C. and agglomerates while driven by surface tension. If pressurized in this state, the molten SAC305 will run off.

It is a usual practice to use the Sn-based solder in a pasty form mixed with a flux, for the purpose of suppressing the surface tension of molten Sn, and increasing the wettability. The flux can be evaporated off in a gaseous form during baking, or can be washed off after baking.

In contrast, a preform added with a flux is less likely to allow the flux to evaporate during baking. The flux may even leave a void where it gasified, and may degrade the quality.

Now the preform for semiconductor encapsulation 1 contains the intermetallic compound $Cu_xSn_y$, and can reduce the surface tension of molten Sn. In addition, the intermetallic compound $Cu_xSn_y$ will serve as a physical barrier to suppress fluidization of the molten Sn.

The preform for semiconductor encapsulation 1 also contains Cu. The molten Sn will therefore show further reduced surface tension of molten Sn. Since not only that Cu particles physically prevent the molten Sn from running off, but also that the molten Sn is consumed for solid-phase diffusion with the adjoining Cu, then Sn will further be less fluidic.

As has been described above, the preform for semiconductor encapsulation 1 can suppress the surface tension of molten Sn. It is therefore no more necessary to add the flux, and thereby the void may be reduced. It now also becomes possible to suppress the fluidity of molten Sn, and to form the sealing layer at an aimed position.

Figure 3:
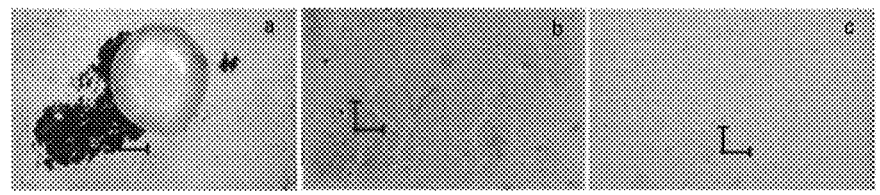
FIG. 3 shows images comparatively explaining surface tension of the preform for semiconductor encapsulation of this invention and SAC305.

FIG. 3 shows images of states of the preform whose surface tension reduces as a result of inclusion of the intermetallic compound, and inclusion of Cu as described above. Images "a", "b" and "c" in FIG. 3 respectively show states of preforms for semiconductor encapsulation, having the compositions below, manufactured by the method shown later in FIG. 8, and observed after baking at approximately 240° C.:

a: SAC305 powder;

b: alloy powder of Cu and Sn containing approximately 10 to 20% by weight of the intermetallic compound; and c: powder obtained by mixing 30% by weight of SAC305 powder, 35% by weight of alloy powder of Cu and Sn described in "b", and 35% by weight of Cu powder.

With composition "a", the corresponding image shows agglomeration of the molten Sn due to surface tension. In contrast, with compositions "b" and "c", the corresponding images show the molten Sn which is prevented from agglomerating due to reduced surface tension.

The preform for semiconductor encapsulation 1 contains the intermetallic compound $Cu_xSn_y$. Owing to the intermetallic compound interlaid between Sn and Cu, there will be only a limited area where Sn and Cu come into direct contact, thereby the diffusion rate may be suppressed, unbalanced mutual diffusion may be moderated, and Kirkendall void may be suppressed from generating as a consequence.

Figure 4:
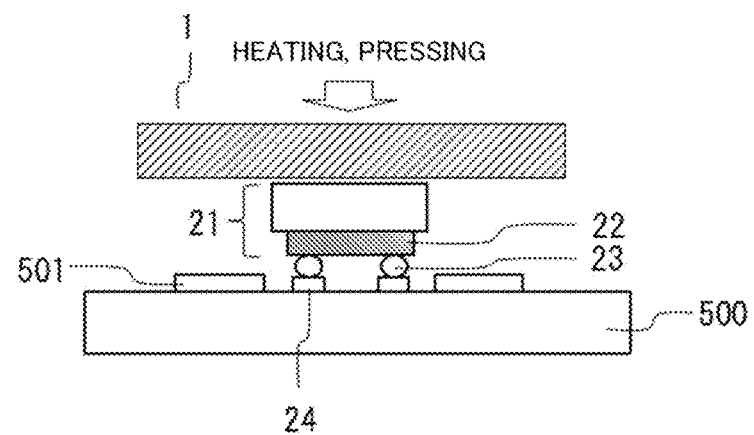
FIG. 4 is a schematic drawing illustrating an exemplary method of manufacturing a semiconductor device of this invention.

An exemplary method of manufacturing the sealing layer is shown in FIG. 4. The preform for semiconductor encapsulation 1 is placed on a semiconductor element, and then pressed under heating to form the sealing layer. Since the preform for semiconductor encapsulation 1 is kept less fluidic and thus scarcely runs off, so that the sealing layer may be formed at an aimed position.

Temperature and time of heating depend on the composition of the preform for semiconductor encapsulation 1, wherein in this embodiment, the temperature was gradually elevated, and kept at approximately 280° C. for 1 to 20 minutes.

Figure 5:
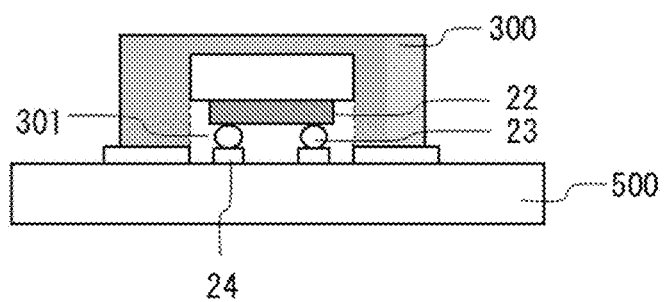
FIG. 5 is a schematic drawing illustrating an exemplary semiconductor device of this invention.

An exemplary semiconductor device manufactured by the aforementioned method is shown in FIG. 5. An electronic circuit 22, when typically designed to be a sensor circuit, will be disabled to function as a sensor circuit if buried in the sealing layer. In contrast, by forming the sealing layer using the preform for semiconductor encapsulation 1, the encapsulant is prevented from entering under the semiconductor element, so as to reserve a space 301. In this way, the sensor circuit may be manufactured easier than in the prior art, with lower manufacturing cost.

Further, in FIGS. 4 and 5, the reference numerals 23, 24, 500 and 501 show a terminal, interconnect part, substrate and joint portion, respectively.

Figure 6:
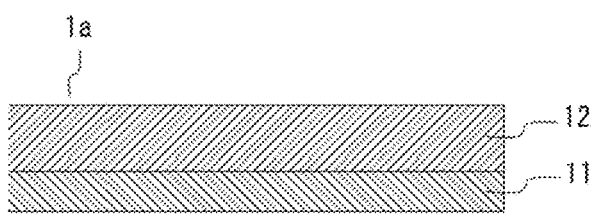
FIG. 6 is a schematic drawing illustrating an exemplary multi-layered preform for semiconductor encapsulation of this invention.
Figure 7:
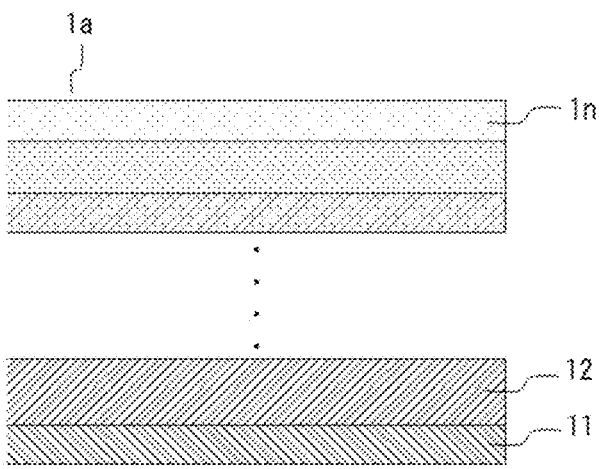
FIG. 7 is a schematic drawing illustrating still another example of the multi-layered preform for semiconductor encapsulation of this invention.

FIG. 6 is a schematic drawing illustrating a multi-layered preform for semiconductor encapsulation 1a. The multi-layered preform for semiconductor encapsulation 1a contains at least a first layer 11 and a second layer 12. FIG. 7 illustrates another example of the multi-layered preform for semiconductor encapsulation 1a of this invention. Depending on applications and purposes, a plural number "n" of preforms (11, 12, . . . 1n) may be laminated. For example, a variety of operations and effects may be added by laminating a sheet having an electromagnetic shielding effect, or a sheet that contributes to heat dissipation. It is therefore made possible to enhance the functionality of the multi-layered preform for semiconductor encapsulation 1a as a whole.

Figure 8:
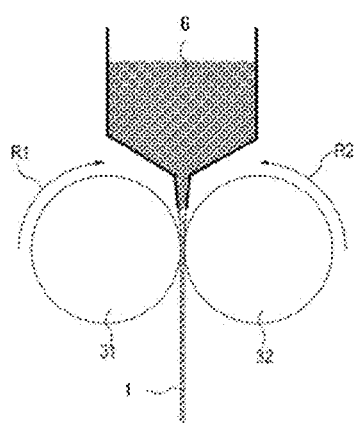
FIG. 8 is a schematic drawing illustrating an exemplary method of manufacturing a preform for semiconductor encapsulation, based on rolling.

The preform for semiconductor encapsulation 1 of this invention may be obtained typically by powder rolling by which metal powder is made into sheet by rolling. A wide variety of powder rolling methods have been known, and may be applicable to this invention. FIG. 8 illustrates a typical case applicable to this invention. Referring now to FIG. 8, a metal powder 6 is fed between the rolling mill rolls 31, 32 that rotate in opposing directions R1, R2, and the metal powder 6 is pressurized by the rolling mill rolls 31, 32, to be given in the form of preform for semiconductor encapsulation 1. By stacking the preforms for semiconductor encapsulation 1, and further rolling them together, the multi-layered preform for semiconductor encapsulation 1a may be obtained. Thickness of the individual preforms, and the total thickness of the multi-layered preform for semiconductor encapsulation may be determined properly depending on applications and purposes.

Having detailed this invention referring to the attached drawings, this invention is not limited thereto, and it is obvious that those skilled in the art will easily conceive various modified examples based on its technical idea and teachings.

As has been described above, according to this invention, it now becomes possible to provide a preform for semiconductor encapsulation with high heat resistance, high reliability and high quality.

What is claimed is:

1. A semiconductor encapsulation preform comprising:
  a flux-free preform formed sheet of a metal or alloy that is Sn or Sn alloy, and, Cu or Cu alloy, and from 10 to 20% by weight of an intermetallic compound consisting of Cu and Sn,
wherein the intermetallic compound of Cu and Sn is present in the preform formed sheet prior to heating of the preform formed sheet during an encapsulation process.

2. A multi-layered preform for semiconductor encapsulation,
the preform comprising at least a first layer and a second layer,
the first layer comprising the semiconductor encapsulation preform formed sheet described in claim 1.

3. A semiconductor device comprising:
a semiconductor element;
an interconnect part that is electrically connected to the semiconductor element; and
a sealing layer that encapsulates the semiconductor element,
the sealing layer being formed by heating the semiconductor encapsulation preform formed sheet containing the intermetallic compound of Cu and Sn described in claim 1.

4. A semiconductor device comprising:
a semiconductor element;
an interconnect part that is electrically connected to the semiconductor element; and
a sealing layer that encapsulates the semiconductor element,
the sealing layer being formed by heating the multilayered semiconductor encapsulation perform described in claim 2.

5. A multi-layered semiconductor encapsulation preform according to claim 1, comprising a multi-layer preform formed of a metal or alloy consisting of Sn or Sn alloy, and Cu or Cu alloy, and
from 10 to 20% by weight of an intermetallic compound consisting of Cu and Sn,
wherein said preform is formed from stacked multiple powder rolled metal powder sheets of the metal or alloy and the intermetallic compound.

6. A semiconductor encapsulation preform comprising: a flux-free preform formed of at least one sheet of a metal or alloy consisting of Sn or Sn alloy, and, Cu or Cu alloy, and
from 10 to 20% by weight of an intermetallic compound consisting of Cu and Sn,
wherein the intermetallic compound of Cu and Sn is present in the preform formed sheet prior to heating of the preform formed sheet during an encapsulation process.

7. A multi-layered preform for semiconductor encapsulation,
the preform comprising at least a first layer and a second layer, the first layer comprising the semiconductor encapsulation preform formed sheet described in claim 6.

* * * * *